(12) United States Patent
Xu et al.

(10) Patent No.: US 10,215,627 B2
(45) Date of Patent: Feb. 26, 2019

(54) SIGNAL CONDITIONING CIRCUIT FOR A LIGHT SENSOR, A SENSOR ARRANGEMENT AND A METHOD FOR SIGNAL CONDITIONING FOR A LIGHT SENSOR

(71) Applicant: ams AG, Unterpremstätten (AT)

(72) Inventors: Gonggui Xu, Plano, TX (US); Lloyd Hasley, Plano, TX (US); Cecil Aswell, Orangevale, CA (US)

(73) Assignee: ams AG, Unterpremstaetten (AT)

( * ) Notice: Subject to any disclaimer, the term of this patent is extended or adjusted under 35 U.S.C. 154(b) by 385 days.

(21) Appl. No.: 14/195,801

(22) Filed: Mar. 3, 2014

(65) Prior Publication Data

US 2014/0252212 A1    Sep. 11, 2014

Related U.S. Application Data

(60) Provisional application No. 61/774,751, filed on Mar. 8, 2013.

(30) Foreign Application Priority Data

Apr. 24, 2013   (EP) .................................... 13165171

(51) Int. Cl.
   *G01J 1/44*   (2006.01)
   *G01J 1/42*   (2006.01)
   *H03F 3/08*   (2006.01)

(52) U.S. Cl.
   CPC ............... *G01J 1/44* (2013.01); *G01J 1/4204* (2013.01); *H03F 3/08* (2013.01)

(58) Field of Classification Search
   CPC .......... H03F 3/087; H03F 3/08; G01J 1/4204; G01J 1/44; G01J 2001/4242; G01J 2001/4238; G01J 1/4228
   USPC .... 250/208.1, 205, 216, 221, 214.1, 214 LS, 250/214 A, 214 LA; 345/158, 169, 166, 345/207, 205, 213, 214
   See application file for complete search history.

(56) References Cited

U.S. PATENT DOCUMENTS

| | | | |
|---|---|---|---|
| 2004/0080623 A1 | 4/2004 | Cleveland et al. | |
| 2006/0245623 A1* | 11/2006 | Loiacono | G06K 9/2027 382/117 |
| 2010/0065720 A1 | 3/2010 | Raynor et al. | |
| 2010/0277075 A1 | 11/2010 | Rees | |
| 2011/0248875 A1* | 10/2011 | Holcombe | G01S 3/7803 341/143 |
| 2012/0287417 A1* | 11/2012 | Mimeault | G01C 3/08 356/5.01 |

(Continued)

*Primary Examiner* — Georgia Y Epps
*Assistant Examiner* — Don Williams
(74) *Attorney, Agent, or Firm* — Fish & Richardson P.C.

(57) ABSTRACT

A signal conditioning circuit for a light sensor, in particular for an ambient light sensor, comprises a first integration stage (INT1) connected to a first sensor input (IN1) to receive a first and second sensor signal and a second integration stage (INT2) comprising a coupling input (IN2) to receive from the first integration stage (INT1) a first and second integrated sensor signal. A coupling stage (S3, C5) is connecting the first and second integration stages (INT1, INT2) and is designed to generate a difference signal from consecutively received integrated first and second integrated sensor signals. A sensor arrangement and a method for signal conditioning for a light sensor is also presented.

21 Claims, 5 Drawing Sheets

(56) References Cited

U.S. PATENT DOCUMENTS

Figure 1:
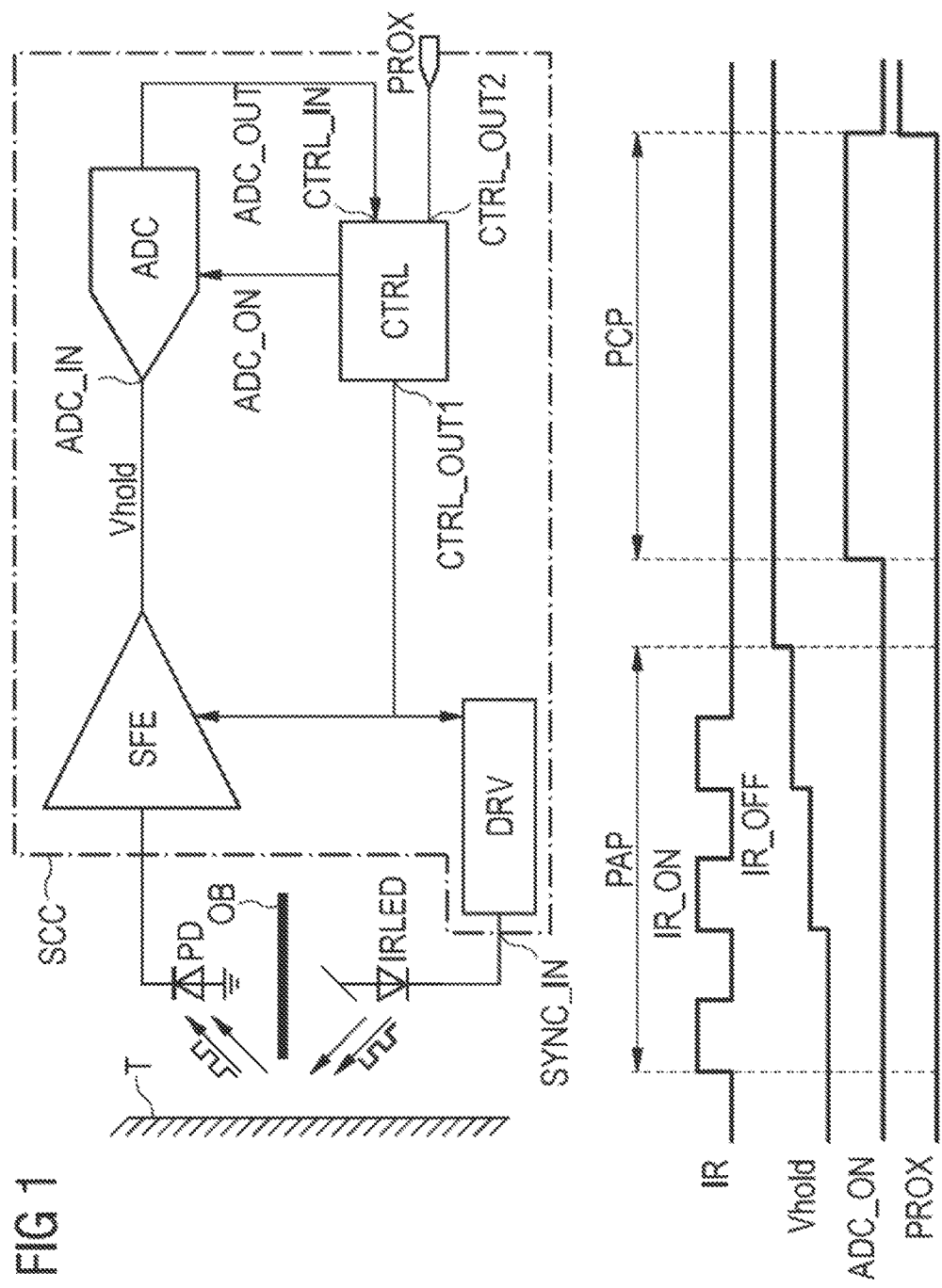

2013/0069808 A1* 3/2013 Reddy ................ H03M 1/1019
341/118

* cited by examiner

SIGNAL CONDITIONING CIRCUIT FOR A LIGHT SENSOR, A SENSOR ARRANGEMENT AND A METHOD FOR SIGNAL CONDITIONING FOR A LIGHT SENSOR

CROSS REFERENCE TO RELATED APPLICATIONS

The present application claims the benefit of U.S. Provisional Patent Application Ser. No. 61/774,751, filed on Mar. 8, 2013, and claims priority to European Patent Application No. 13165171.3, filed on Apr. 24, 2013, both disclosures of which are hereby incorporated by reference in their entirety for all purposes.

DESCRIPTION

This invention relates to a signal conditioning circuit for a light sensor, sensor arrangement and method for signal conditioning for a light sensor.

Light sensors, and especially proximity light sensors have wide applications in consumer electronics. One particular application lies with mobile phones and Smartphones where the proximity light sensor can be used to measure the distance between human ear and phone. If the distance between human ear and phone is sufficiently small, e.g. smaller than 100 mm, then the sensor detection signal indicates the device is held near human ear for conversation and the phone's display panel can be shut down to save power.

Proximity light sensors are, however, exposed to several sources of light, e.g. ambient light not originating from a target to be detected. In order to achieve a robust proximity measurement some means are necessary to account for these sources and derive a corrected sensor detection signal. Furthermore, assembly of the light sensor into a device varies as well, for example different covering glass and usage variation such as the covering case chosen from the end user, and should be accounted for as well.

There is a need in the art to provide a signal conditioning circuit for a light sensor, sensor arrangement and method for signal conditioning for a light sensor to improve robustness of the detection.

According to an aspect of the invention a signal conditioning circuit for a light sensor, in particular for a proximity light sensor, comprises a first integration stage connected to a first sensor input to receive a first and second sensor signal. Furthermore, the circuit comprises a second integration stage comprising a coupling input to receive from the first integration stage a first and a second integrated sensor signal. Finally, the circuit comprises a coupling stage connecting the first and second integration stages.

In operation of the signal conditioning circuit, the first and second integration stages are used to acquire the first and second sensor signal. The coupling stage is designed to generate a different signal from consequently received integrated first and second integrated sensor signals.

By means of the coupling stage, a signal conditioning circuit can account for various signal sources which deteriorate the sensor signal. For example, the first sensor signal can be the main detection signal, i.e. light reflected from a target and ambient light, and the second sensor signal can be an ambient light signal with no detection signal present. An offset signal can be derived from the first and second sensor signals and can be used to improve the robustness of a measurement of a light sensor. Preferably, the difference from the first and second sensor signal is taken.

The resulting offset signal is a means to improve the detection robustness of the signal conditioning circuit. Varies offset sources can be accounted for and influence of noise can also be reduced.

According to another aspect of the invention, a first switch is electrically connecting the sensor input to the first integration stage during a first and second acquisition phase. The first switch is electrically disconnecting the sensor input from the first integration stage during a first and second transfer phase, respectively.

A light sensor used together with the signal conditioning circuit acquires the first or second sensor signal. Usually, these sensor signals are temporarily saved on the light sensor itself, for example by means of a capacity of the photodiode. During the first and second acquisition phase the first and second sensor signals from the light sensor are integrated onto the first and second integration stage, respectively. During the first and second transfer phases, the integrated first and second sensor signals are then transferred for further processing, for example by means of the coupling stage or are being presented at a signal output of the signal conditioning circuit.

According to another aspect of the invention the coupling stage comprises a coupling switch. The coupling switch is electrically connecting the first and second integration stages during the first and second transfer phases, respectively. By using the coupling switch of the coupling stage, the first and second transfer phase are used to transfer the integrated first and second sensor signals onto the second integration stage.

According to another aspect of the invention, the coupling stage comprises a coupling capacitor connected between the coupling switch and the coupling input.

The coupling capacitor is used to temporarily save either the first or second integrated sensor signals. By connecting the coupling capacitor between the first and second integration stages, a difference signal from the first and second integrated sensor signals can be derived.

According to another aspect of the invention, the first integration stage comprises a first integrator comprising a first amplifier connected via its negative input to the first switch and comprising an adjustable first capacitor connecting a negative input of the first amplifier with an output of the first amplifier. Furthermore, the second integrated stage comprises a second integrator comprising a second amplifier connected via its negative input to the coupling capacitor and comprising a second capacitor connecting the negative input on the second amplifier via a second switch with an output of the second amplifier.

According to another aspect of the invention, a signal output of the signal conditioning circuit is connected to the second switch and to the output of the second amplifier.

During the first transfer phase, the second switch is electrically disconnecting the second capacitor from the output. During the second transfer phase, the second switch is electrically connecting the sensor capacitor to the output.

According to another aspect of the invention, the signal conditioning circuit comprises a third switch connected in parallel to the first capacitor.

The third switch is used to cancel charge present on the first capacitor by means of electrically connecting and disconnecting the first switch and the amplifier input of the first amplifier to the coupling switch and the amplifier output of the first amplifier during a first charge cancelling phase. The first charge cancelling phase is executed between each first and second acquisition phase and between each first and second transfer phase, respectively.

According to another aspect of the invention, the signal conditioning circuit comprises a fourth switch connected in parallel to the second capacitor.

The fourth switch is designed to cancel charge present on the second capacitor by means electrically connecting and disconnecting the coupling capacitor and the amplifier input of the second amplifier to the signal output and the amplifier output of the second amplifier. The electrical connecting is done during the first transfer phase and the electrical disconnecting is done during the second transfer phase.

According to another aspect of the invention, the first integration stage is connected to a first offset injection circuit. The first offset injection circuit is used to apply a first predetermined offset value during a third transfer phase. In addition, or alternatively, the second integration stage is connected to a second offset injection circuit to apply a second predetermined offset value during a fourth transfer phase.

According to another aspect of the invention, the signal output is connected to a first input of an adder. A second input of the adder is connected to a third offset injection circuit. An output of the adder is connected to an analog-to-digital converter input.

According to another aspect of the invention, the first and/or second amplifier comprises a folded cascode amplifier, respectively.

According to another aspect of the invention an analog-to-digital converter comprising a converter input connected to the signal output or, alternatively, to the analog-to-digital converter input, comprises a converter output. A controller unit comprises a controller input to receive an output signal of the analog-to-digital converter, comprises a first converter output to provide control signals to the switches of the signal conditioning circuit, and comprises a second converter output for providing a proximity signal. Finally, a driver circuit is connected to the controller unit and designed to receive a synchronization signal at a synchronization input.

According to another aspect of the invention, a sensor arrangement having one of the above described signal conditioning circuits comprises a photo detector connected to the first sensor input and a light-emitting device connected to the synchronization input.

According to another aspect of the invention, the driver circuit is synchronized to a duty cycle of the light-emitting device.

According to another aspect of the invention, a method for signal conditioning for a light sensor, in particular for a proximity light sensor, comprises the steps of, in a first transfer phase, integrating a first sensor signal and transferring the integrated first sensor signal into a first integration stage. Then, transfer an integrated sensor signal into a second integration stage. A second transfer phase comprises the steps of integrating a second sensor signal and transferring the integrated second sensor signal into the first integration stage. Then, transfer the integrated first sensor signal into the second integration stage. A difference signal of the first and second sensor signals is calculated by means of a coupling stage.

The resulting difference or offset signal is a means to improve the detection robustness of a signal conditioning circuit. Varies offset sources can be accounted for and influence of noise can also be reduced.

Preferably, the above mentioned steps are executed after initializing the light sensor by charge cancelling capacities used with the light sensor and a signal conditioning circuit.

In the following, the principle presented above will be described in more detail with respect to drawings in which exemplary embodiments are presented.

Figure 2:
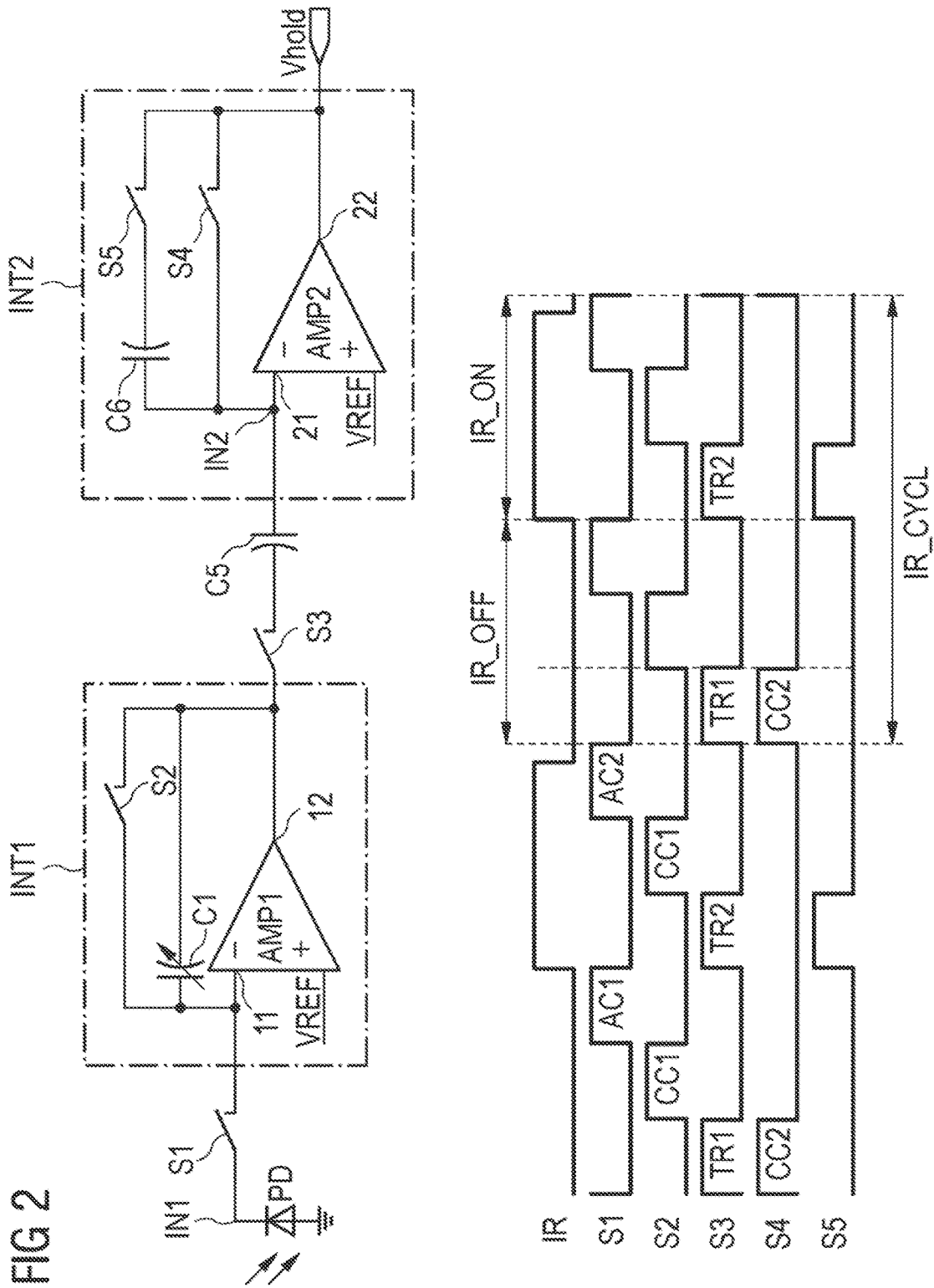
Figure 3:
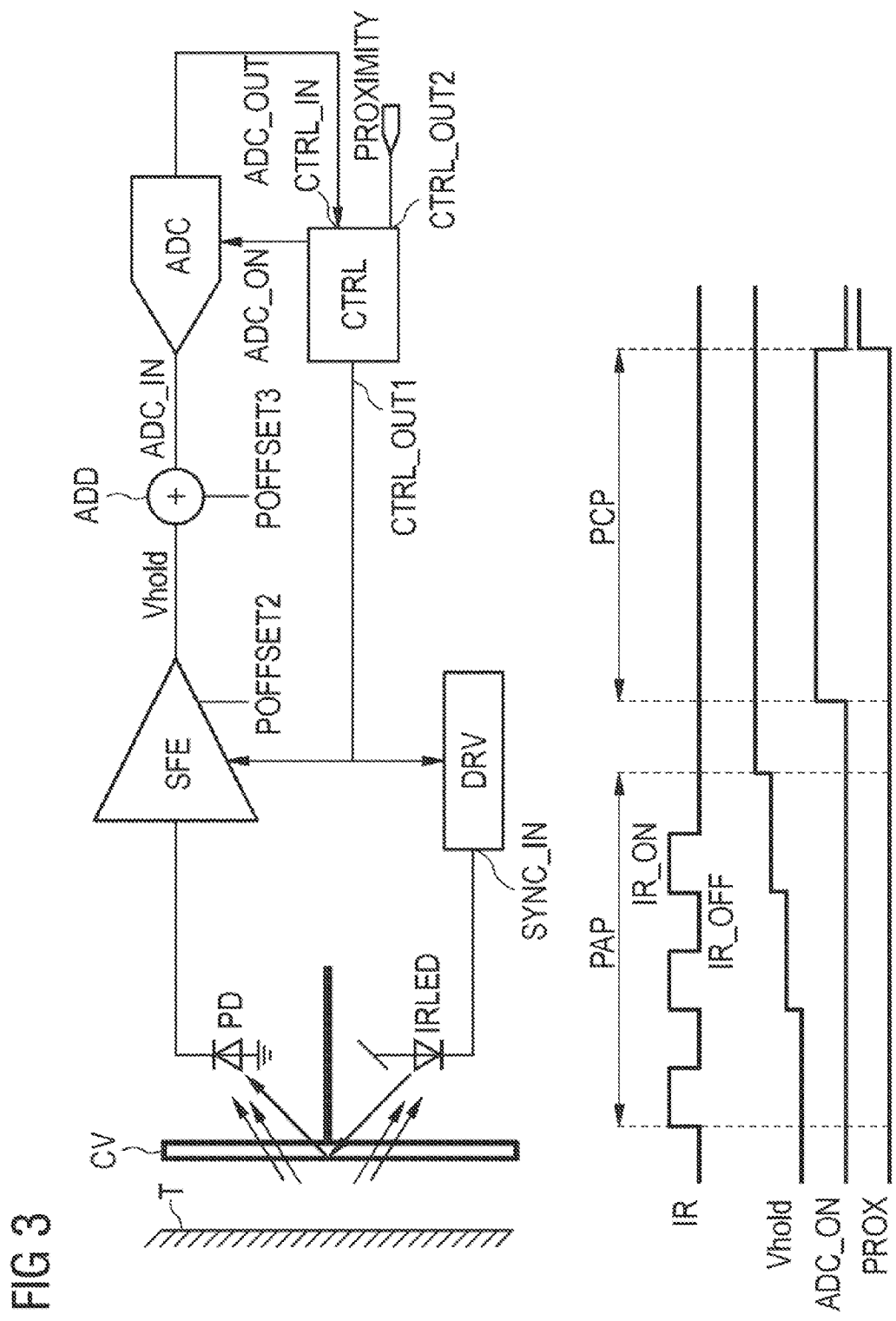
Figure 4:
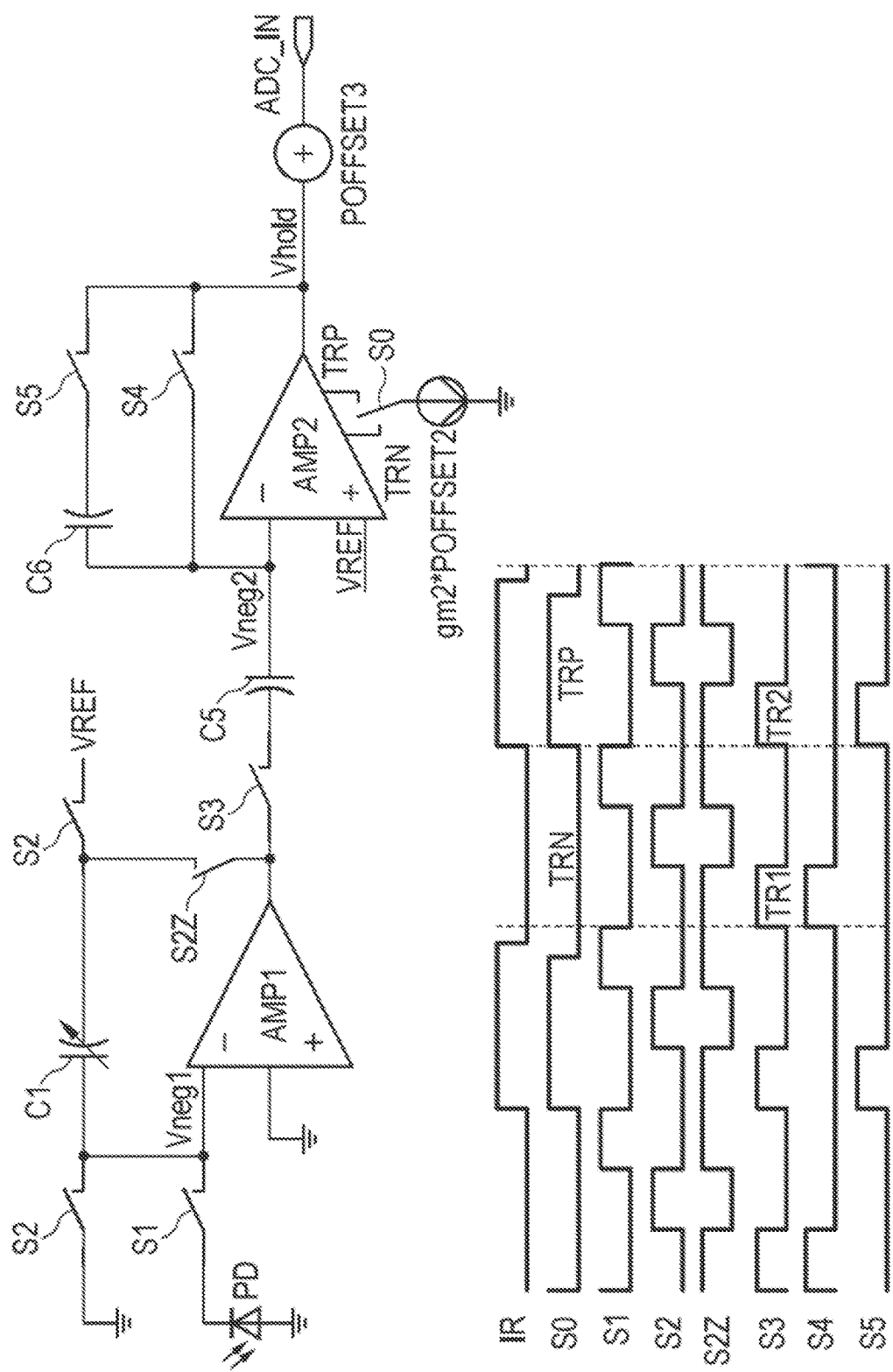
Figure 5:
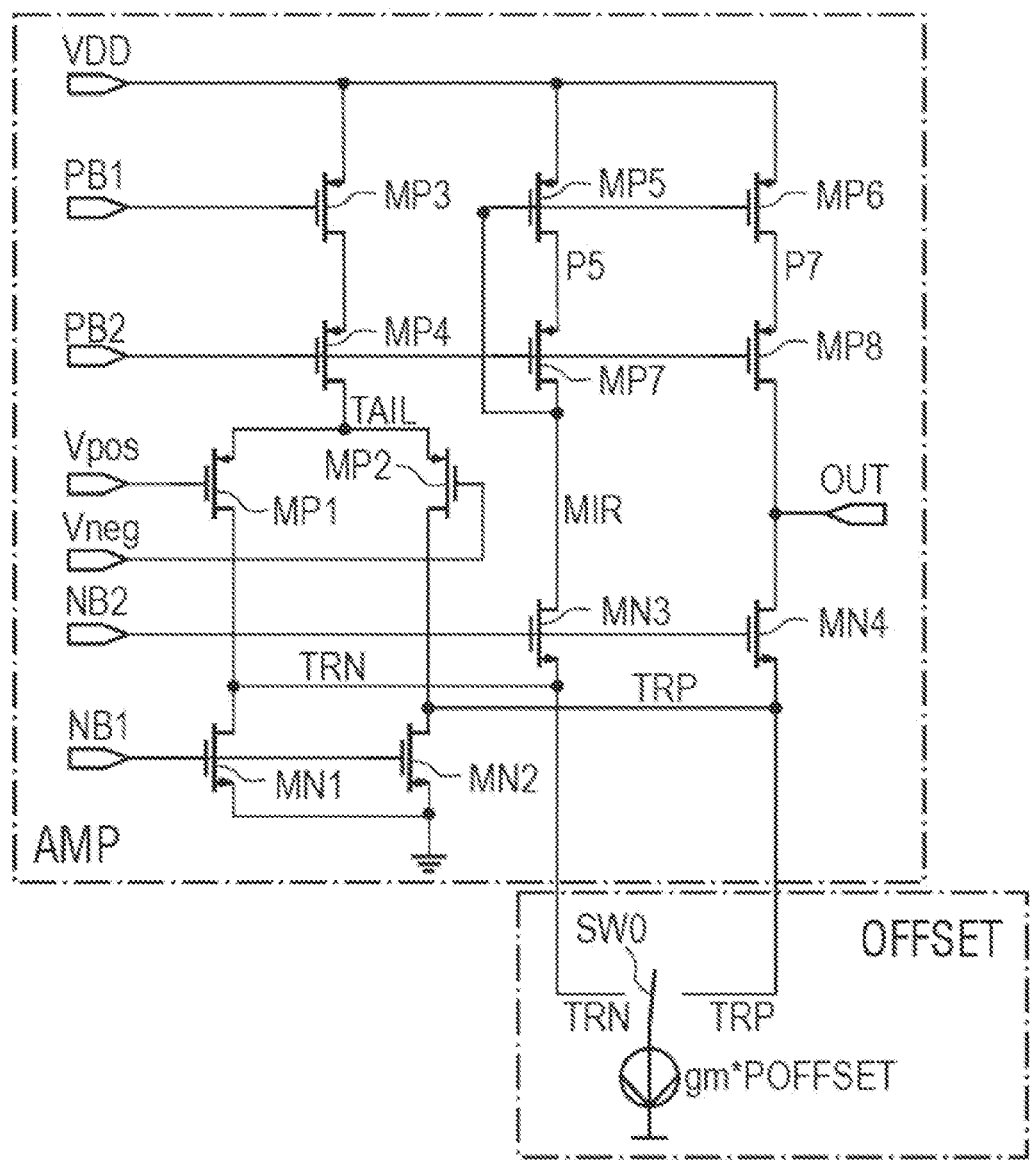

FIG. 1 shows an exemplary sensor arrangement according to the principle presented, FIG. 2 shows an exemplary signal conditioning circuit according to the principle presented, FIG. 3 shows another exemplary sensor arrangement according to the principle presented, FIG. 4 shows another exemplary signal conditioning circuit according to the principle presented, FIG. 5 shows an exemplary offset injection circuit according to the principle presented.

FIG. 1 shows an exemplary sensor arrangement according to the principle presented. The drawing shows a signal conditioning circuit connected to a proximity light sensor.

The light sensor comprises a photodiode PD and a light emitting diode IRLED, which in this example is an infrared light emitting diode. The photodiode PD and the light emitting diode IRLED are separated by an optical barrier OB and are mounted into a common package (not shown).

During operation the light sensor emits pulses of light IR, here infrared light, towards a target T. The photodiode PD is placed so it can detect light reflected from the target T.

In typical phone applications, a flat panel display consumes a considerable amount of power when it is turned on, e.g. 30% of total power. Therefore, it is beneficial to turn the display off whenever the display panel is not used. When a person raises the phone close to his ear to talk, the display panel is not used and can be shut down to save power. The proximity light sensor can be used for this application. The idea for the sensor to detect the target T is to emit a light (infrared light for example) towards the target and detect the light reflection from the target. The more light reflected back and detected, the closer the target is. The less light reflected back and detected, the far the target is.

The signal conditioning circuit comprises a signal front end SFE, an analog-to-digital converter ADC, a controller unit CTRL, and a driver circuit DRV. The analog-to-digital converter ADC comprising a converter input ADC_IN connected to the signal output Vhold of the signal front end SFE, and a converter output ADC_OUT. The controller unit CTRL comprises a controller input CTRL_IN to receive an output signal ADC_OUT of the analog-to-digital converter ADC. The controller unit CTRL comprises a first converter output CTRL_OUT1 to provide control signals to switches of the signal front end SFE which will be described in more detail below. The controller unit CTRL comprises a second converter output CTRL_OUT2 for providing a proximity signal PROX. The driver circuit DRV is connected to the controller unit CTRL and designed to release a synchronisation signal IR_CYCL at a synchronisation output SYNC_IN to synchronize the signal conditioning circuit to a duty cycle of the light sensor.

During the reflection light detection, the photodiode PD is also exposed to ambient light. In order for the photodiode to reject ambient light, the light sensor consecutively takes two measurements: one measurement is ambient light only (when IRLED light emitter is off (see reference sign IR_OFF); the other measurement is ambient light plus the light IR reflected back from the target T, i.e. the light emitting diode IRLED is on (see reference sign IR_ON). Since the ambient light is relatively constant in two close measurements, the ambient light portion can be cancelled out if two close light measurements are subtracted from each other.

To cancel the ambient light, a 50% duty cycle light pulse IR_CYCL is used to drive the light emitting diode IRLED. This duty cycle is set by the driver DRV. Also, to accurately track the light emitting and detection, the driver DRV and photodiode PD are synchronized. In order to have more effective reflected light detection, multiple light pulses IR can be used and small reflected light signal from each pulse reflection will be accumulated into a larger reflected light signal.

The final accumulated light reflection will be converted to a voltage at the signal output Vhold and held inside the signal front end SFE as will be discussed with respect to FIG. 2. Then, the analog to digital converter ADC will be started by means of a start signal ADC_ON provided by the controller unit CTRL and generate a proximity count signal PROX from the output signal of the analog to digital converter ADC_OUT to feed into an upper system level for decision making The bottom part of FIG. 1 shows the sensor operation timing. In this particular example, every three pulses are used during a proximity accumulation phase PAP. As the light accumulates, the holding voltage at signal output Vhold will step up with each pulse IR_ON, IR_OFF. When the proximity accumulation phase PAP is over, the holding voltage at signal output Vhold will be held steady for subsequent ADC conversion signalled by start signal ADC_ON. At the end of proximity conversion phase PCP, the proximity count signal PROX in the timing diagram will be generated.

FIG. 2 shows an exemplary signal conditioning circuit according to the principle presented. The drawing shows the circuit component of the sensor front end SFE of the signal conditioning circuit in FIG. 1 and operational timing in more detail.

The top part of FIG. 2 is the circuit architecture. A first integration stage INT1 is connected to a first sensor input IN1 to receive a first and second sensor signal. A second integration stage INT2 comprises a coupling input IN2 to receive from the first integration stage INT1 a first and second integrated sensor signal. A coupling stage comprising a coupling switch S3 and coupling capacitor C5 connects the first and second integration stages INT1, INT2.

The first integration stage INT1 further comprises a first integrator comprising a first amplifier AMP1 connected via its negative input 11 to the sensor input IN1 via a first switch S1 and comprising an adjustable first capacitor C1 connecting a negative input 11 of the first amplifier AMP1 with an output 12 of the first amplifier AMP1. A third switch S2 is connected in parallel to the first capacitor C1.

The second integration stage INT2 comprises a second integrator comprising a second amplifier AMP2 connected via its negative input 21 to the coupling capacitor C5 and comprising a second capacitor C6 connecting the negative input 21 of the second amplifier AMP2 via a second switch S5 with an output 22 of the second amplifier AMP2. A fourth switch S4 is connected in parallel to the second capacitor C6.

The switches S1, S2, S3, S4, and S5 are sampling and controlling switches. Amplifiers AMP1 and AMP2 are the two amplifiers to assist signal sampling and integration. In the following the term high refers to the electrically connecting state of a switch whereas the term low refers to the electrically disconnecting state of a switch. With respect to the light emitting diode IRLED the terms high and low refer to light emitting or non light emitting states or, alternatively, on and off states IR_ON, IR_OFF, respectively.

The bottom part of FIG. 2 shows the timing of switches which, in this example, is associated or synchronized to light pulse IR detection during proximity accumulation phase PAP. The timing of switching operation for one pulse cycle or duty cycle IR_CYCL is labelled and explained in the following.

During either IR pulse on or IR pulse off, the photodiode PD will convert the detected photons into charge and the charge will be integrated by the junction capacitance associated with photodiode. This way the photodiode detects first and second sensor signals, respectively.

During any particular pulse cycle IR_CYCL, when pulse is off (e.g. 50% of one cycle period), the photodiode PD detects and integrates the ambient light only; when pulse is on (e.g. 50% of one cycle period), the photodiode PD detects and integrates the ambient light plus the reflected light.

When sensor switch S1 is off, the charge integrated by the photodiode PD will be held by the photodiode. When S1 is on, i.e. during the first and second acquisition phases AC1, AC2, the photon charge will be transferred from photodiode into integration capacitor C1 by the first integration stage (AMP1, S2, variable capacitor C1). The first capacitor C1 can be adjusted for different proximity gain, e.g. the larger the capacity of capacitor C1, the smaller the voltage signal on capacitor C1; the smaller the capacity of capacitor C1, the bigger the voltage signal.

The on state of the sensor switch S1 determines first and second acquisition phases AC1, AC2. Prior to each of the acquisition phases AC1, AC2, the integration capacitor C1 is cleared first by closing the switch S2 during charge cancelling phases CC1, CC2.

The detection of the reflected light signal and the rejection of the ambient light are accomplished from a differential operation between two light integrations (one for the first sensor signal, i.e. light on IR_ON, the other for the second sensor signal, i.e. light off IR_OFF. This is done by two consecutive charge transfers from first stage INT1 (AMP1, C1, S2) to the second stage INT2 (AMP2, C6, S4 and S5) through the coupling switch S3 and coupling capacitor C5.

A first charge transfer during a first transfer phase TR1 (IRLED pulse low, S3 high, S4 high, S5 low) is from first integration capacitor C1 into the coupling capacitor C5. During the first transfer phase TR1, the charge transferred is actually from previous photodiode integration (for both ambient and proximity sensor light). Also, starting from first transfer phase TR1, the photodiode PD is integrating charge from ambient light only IR_OFF and this charge will be transferred from integration stage INT1 to integration stage INT2 during a second charge transfer phase TR2.

A second charge transfer during a second transfer phase TR2 (IRLED pulse high, S3 high, S4 low, S5 high) is from integration capacitor C1 into coupling capacitor C5, and finally to second capacitor C6. The charge transferred during the first transfer phase TR1 is held at an isolated node Vneg2 after switch S4 is open. During the second transfer phase TR2, a new charge transfer will recharge coupling capacitor C5 again. However, since switch S4 is open and coupling switch S5 is closed, the difference of the two charge transfers phases TR1, TR2 will be stored at the second capacitor C6. As the result of one IRLED pulse cycle IR_CYCL operation, the charge transferred to the second capacitor C6 is the reflected IRLED light only, the ambient light portion is rejected by the different coupling capacitor C5 configuration between the transfer phases TR1 and TR2.

This operation can be done for multiple IRLED pulses during the proximity accumulation phase PAP. After the proximity accumulation phase PAP, an accumulated proximity voltage signal is present at the signal output Vhold and is held steady by the second amplifier AMP2 and integration capacitor C6 for next phase, i.e. the proximity conversion phase PCP. In the proximity conversion phase PCP the held voltage at the signal output Vhold will be digitized by means of the analog to digital converter and the controller unit CTRL into the final proximity signal PROX.

FIG. 3 shows another exemplary sensor arrangement according to the principle presented. This sensor arrangement is based on the one shown in FIG. 1. However, this proximity sensor arrangement comprises a flexible offset correction scheme based on offset injection circuit POFFSET2, POFFSET3. One idea for the proposed solution is to provide equal and opposite offset to cancel the covering glass cross talk and other error sources.

However, when cell phone manufacturers use a proximity light sensor, it is common practice to use a covering glass CV to hide the sensor from the end user (not shown in the figures). Each time, when the IRLED pulse is fired, not all the emitted IRLED light passes through the covering glass CV. Some of emitted IRLED light will be reflected back by covering glass into the photodiode. If this covering glass CV reflection is not accounted for by the sensor arrangement, a bogus proximity signal will be generated and eventually a wrong decision is made. In fact, for each IRLED pulse, the reflection from covering glass is detected by the signal conditioning circuit on top of desired proximity reflected light signal. As a result, the signal accumulated is larger compared to desired proximity voltage. Moreover, with increasing number of IRLED pulses, the signal at the signal output Vhold increases. Thus, the covering glass cross talk can quickly saturate the signal conditioning circuit.

The offset injection circuits are based on the design presented in FIG. 5. A first offset injection circuit POFFSET1, POFFSET2 is connected to the first and/or second integration stages. A third offset injection circuit POFFSET3 is connected to an adder ADD connecting the signal output Vhold to the input ADC_IN of the analog to digital converter ADC.

The offset injection circuits have an adjustable gain. Also, the sensor arrangement can use multiple IRLED pulse cycles. To take care of these factors, i.e. gain and multiple cycles, several offset injection points can used:

A. Cancel the unintended optical/electrical offsets which are proportional to the number of IRLED pulse by injection of equal but opposite polarity of offsets at the integration stages INT1, INT2 using the first or second offset injection circuits POFFSET1, POFFSET2

B. For different gain setting, offset provided the first or second offset injection circuits POFFSET1, POFFSET2 can be scaled up or down accordingly to the gain.

C. Cancel the unintended optical/electrical offsets independent to the number of IRLED pulses and independent to gain by injection of equal but opposite polarity of offsets after the sensor front end SFE using the third offset injection circuit POFFSET3.

Since the sensor arrangement can be synchronized the offset correction may also be synchronized to light integration and charge transfer. The implementation of synchronized offset adjustment is further explained with respect to FIG. 4.

FIG. 4 shows another exemplary signal conditioning circuit according to the principle presented. The circuit shown in the upper part differs from the one shown in FIG. 2 in the following components. There is another switch S2Z connected to switch S2 and the amplifier output 12. Furthermore, connected to the second amplifier AMP2 is an offset injection circuit POFFSET2 with gain gm2 via switch S0. The drawing also shows adder ADD and the third offset injection circuit POFFSET3.

In the bottom part of FIG. 4, the switching operation for one IRLED pulse cycle is labelled and the switching operation is explained in the following. During either IRLED pulse on IR_ON or IRLED pulse off IR_OFF, the photodiode PD will convert the detected photon into charge and the charge will be integrated by the junction capacitance associated with photodiode.

During any particular IRLED pulse cycle IR_CYCL, when IRLED pulse is off (e.g. 50% of one cycle period), the photodiode detects and integrates the ambient light only; when IRLED pulse is on (e.g. 50% of one cycle period), the photodiode detects and integrates the ambient light plus the reflected IRLED light.

When the sensor switch S1 is off, the charge integrated by the photodiode PD will be held by the photodiode. When sensor switch S1 is on, the photon charge will be transferred from photodiode into first integration capacitor C1 by first integration stage INT1 (AMP1, S1, S2, variable capacitor C1). The integration capacitor C1 can be adjusted for different proximity gain: the larger the capacity of first capacitor C1, the smaller the voltage signal on C1; the smaller first integration capacitor C1, the bigger the voltage signal on C1.

During first and second charge cancellation phases CC1, CC2 the switch S2 is closed and the integration capacitor C1 is cleared and pre-charged to a predetermined voltage level VREF. This helps to setup the first amplifier's AMP1 input 11a common mode voltage to ground and sets the initial first amplifier's AMP1 output voltage level to voltage level VREF.

During phase inverted charge cancellation phase, the first amplifier AMP1 is closed by means of a switch S2Z: in phase with the sensor switch S1, the charge is transferred from photodiode to first capacitor C1; during phase first and second transfer phases TR1, TR2, the charge is transferred from integration stage INT1 (AMP1 and C1) to integration stage INT2 (C5, AMP2 and C6). Other phases and operation of switches S3/S4/S5 are similar to the circuit operation in FIG. 2.

In the following the offset correction operation will be explained. Since the proximity offset and optical cross talk are generated between two consecutive light integrations and transfers (one for IRLED pulse on, the other for IRLED pulse off) the offset adjustment is implemented during the transfer phases TR1, TR2 initiated by coupling switch S3.

During first transfer phase TR1 (IRLED PULSE low, S1 low, S2Z high, S3 high, S4 high, S5 low), the charge to be transferred is for ambient light plus proximity light. During TR1, S0 is low, the offset current is injected to negative offset node TRN of the second amplifier AMP2. The generated negative offset at the second AMP2 input actually means positive offset in terms of charge on capacitor C5.

During the second transfer phase TR2 (IRLED pulse high, S1 low, S2Z high, S3 high, S4 low, S5 high), the charge to be transferred is for ambient light only. During the second transfer phase TR2, switch S0 is high, the offset current is injected to positive offset node TRP of the second amplifier AMP2. The generated positive offset at the second amplifier AMP2 input actually means negative offset in terms of charge on capacitor C5.

The charge transferred during the first transfer phase TR1 (IRLED PULSE low, S3 high, S4 high, S5 low) is held at isolated node Vneg2 after switch S4 is open. The charge transferred during the second transfer phase TR2 (IRLED pulse high, S3 high, S4 low, S5 high) is from first capacitor C1 into coupling capacitor C5, and finally to second capacitor C6. The difference in charge of two charge transfers will include three parts: reflected IRLED light from target, the proximity offset (including cross talk from covering glass) and offset correction. If the proximity offset (including cross talk from covering glass) and offset correction cancel each other, only the reflected IRLED light from the target will be stored at second capacitor C6.

This operation can be done for multiple IRLED pulses. Since the optical cross talk for each IRLED pulse is cancelled by the offset correction (from POFFSET2), multiple IRLED pulses generate accumulated reflected IRLED light without offset.

If the proximity offset source, i.e. the offset injection circuit, is before the second integration stage INT2, the offset value can be scaled up or down to correct this offset. If the offset is coming from system initialization offset during initial circuit configuration, a one-time offset correction by means of the third offset injection circuit POFFSET3 is implemented at the adder ADD.

Compared to the analog front end shown in FIG. 2, there are several improvements. FIG. 2, the voltage level VREF is used in first amplifier AMP1 positive input. Any VREF noise will be amplified by the ratio of 1+C1/Cpd, where Cpd is the capacitance associated to the photodiode PD. In FIG. 5, the positive input of AMP1 is tied to ground, and the noise source is eliminated. Furthermore, in FIG. 2, the first capacitor C1 is cleared by closing switch S2. In FIG. 5, the first capacitor C1 is pre-charged to voltage level VREF during charge cancellation phases CC1, CC2.

In FIG. 5, in order to inject desired offset gracefully into the input Vneg2 of the second amplifier AMP2 without disturbing the charge transfer, an equivalent current gm2*POFFSET2 is actually injected into the second amplifier's AMP2 input differential pair to create intentional unbalanced current biasing. The unbalanced current biasing will produce the equivalent input offset: gm2 is the AMP2 input trans-conductance; the current gm2*POFFSET2 produces offset voltage POFFSET2 at node Vneg2.

The digital control of POFFSET2 (generated from gm2*POFFSET2 current injection) can be scaled up or down depending on first stage gain and will be multiplied by overall number of IRLED pulses. Since the POFFSET2 injection is at the second integration stage INT2 input where the voltage swing is the smallest the offset correction step size will be independent of the ambient light.

A gain independent and IRLED pulse cycle independent offset POFFSET3 is implemented at the second amplifier AMP2 output and before analog to digital ADC input. The POFFSET3 takes care of offset caused from system initialization. The current injection of gm2*POFFSET2 is through internal nodes (TRN and TRP) in second integration stage INT2.

FIG. 5 shows an exemplary offset injection circuit according to the principle presented. The drawing shows how proximity offset is injected, for example, into the second amplifier AMP2. The same circuit can be used with the first integration stage and the adder ADD. The top part of FIG. 5, in the box labelled as AMP, shows a folded cascode amplifier, for example to implement the first or second amplifier AMP1, AMP2. The bottom part of FIG. 5, in the box labelled as OFFSET, shows how the offset current is injected into the amplifier.

Let POFFSET be a predetermined offset value. When POFFSET=0, the input differential pair (MP1/MP2) is biased equally since MP1=MP2, MN1=MN2, MN3=MN4, MP5=MP6, MP7=MP8. When the switch S0 switches to TRP, node Vneg will become more negative, a positive offset is shown at node Vpos. When the switch S0 switches to TRN, Vneg will become more positive, a negative offset is shown at node Vpos.

The trans-conductance of input differential pair (MP1/MP2) is gm. An input offset POFFSET will produce current gm*POFFSET. That is why the POFFSET will be produced at AMP input when a current of gm*POFFSET is injected into AMP input stage biasing current.

REFERENCE NUMERALS 11 first amplifier input
12 first amplifier output
21 second amplifier input
22 second amplifier output
AC1 first acquisition phase
AC2 second acquisition phase
ADC analog to digital converter
ADC_IN input of the analog to digital converter
ADC_ON start signal
ADC_OUT output of the analog to digital converter
ADD adder
AMP1 first amplifier
AMP2 second amplifier
C1 first capacitor
C5 coupling capacitor
C6 second capacitor
CC1 first charge cancelling phase
CC2 second charge cancelling phase
CTRL controller unit
CTRL_IN control input
CTRL_OUT1 first control output
CTRL_OUT2 second control output
CV cover glass
DRV driver circuit
IN1 sensor input
IN2 coupling input
INT1 first integration stage
INT2 second integration stage
IR light pulse
IR_CYCL duty cycle
IRLED light emitting diode
IR_OFF light pulse off
IR_ON light pulse on
OB optical barrier
PAP proximity acquisition phase
PCP proximity conversion phase
PD photo-detector
POFFSET1 first offset injection circuit
POFFSET2 second offset injection circuit
POFFSET3 third offset injection circuit
PROX proximity signal
S0 switch
S1 switch
S2 switch
S2Z switch
S3 switch
S4 switch
S5 switch
SCC signal conditioning circuit
SFE sensor front end
SYNC_IN synchronisation input
T target
TR1 first transfer phase
TR2 second transfer phase TRN third transfer phase
TRP fourth transfer phase
Vhold signal output
Vneg2 node
VREF voltage level

The invention claimed is:

1. A signal conditioning circuit for a light sensor, comprising:
   a first integration stage connected to a first sensor input to receive a first and second sensor signal;
   a second integration stage comprising a coupling input to receive from the first integration stage an integrated first sensor signal and an integrated second sensor signal, wherein the signal conditioning circuit is an analog signal front end and the first and second integration stages correspond to analog integrators, and wherein the signal conditioning circuit is synchronized to a duty cycle of the light sensor such that the integrated first sensor signal is indicative of reflected light emitted by the light sensor and ambient light, and such that the integrated second sensor signal is indicative of ambient light;
   a coupling stage connected between the first integration stage and the second integration stage and configured to couple the first integration stage with the second integration stage, such that from consecutively received integrated first and second integrated sensor signals a difference signal is generated by the second integration stage, wherein the difference signal is indicative of reflected light emitted by the light sensor, and wherein generating the difference signal corresponds to the signal conditioning circuit operating in a differential operation mode; and
   an analog-to-digital converter at an output side of the signal conditional circuit, wherein the analog-to-digital converter corresponds to offset correction in the analog domain.

2. The signal conditioning circuit according to claim 1, wherein a first switch is electrically connecting the sensor input to the first integration stage during a first and second acquisition phase to integrate the first and second sensor signals by the first integration stage, respectively, and
   wherein the first switch is electrically disconnecting the sensor input from the first integration stage during a first and second transfer phase, respectively.

3. The signal conditioning circuit according to claim 2, wherein the coupling stage comprises a coupling switch wherein the coupling switch is electrically connecting the first and second integration stages during the first and second transfer phase, respectively.

4. The signal conditioning circuit according to claim 3, wherein the coupling stage comprises a coupling capacitor connected between the coupling switch and the coupling input.

5. The signal conditioning circuit according to claim 4, wherein the first integration stage comprises a first integrator comprising a first amplifier connected via its negative input to the first switch and comprising an adjustable first capacitor connecting a negative input of the first amplifier with an output of the first amplifier, and
   wherein the second integration stage comprises a second integrator comprising a second amplifier connected via its negative input to the coupling capacitor and comprising a second capacitor connecting the negative input of the second amplifier via a second switch with an output of the second amplifier.

6. The signal conditioning circuit according to claim 5, wherein a signal output of the signal conditioning circuit is connected to the second switch and to the output of the second amplifier,
   wherein during the first transfer phase the second switch is electrically disconnecting the second capacitor from the output, and
   wherein during the second transfer phase the second switch is electrically connecting the second capacitor to the output.

7. The signal conditioning circuit according to claim 5 or 6, comprising a third switch connected in parallel to the first capacitor, and
   configured to cancel charge present of the first capacitor by electrically connecting and disconnecting the first switch and the amplifier input of the first amplifier to the coupling switch and the amplifier output of the first amplifier in a first charge cancelling phase wherein the charge cancelling phase is executed between each first and second acquisition phase and each first and second transfer phase, respectively.

8. The signal conditioning circuit according to claim 5, comprising a fourth switch connected in parallel to the second capacitor,
   configured to cancel charge present of the second capacitor by electrically connecting and disconnecting the coupling capacitor and the amplifier input of the second amplifier to the signal output and the amplifier output of the second amplifier, and
   electrically connecting during the first transfer phase and electrically disconnecting during the second transfer phase.

9. The signal conditioning circuit according to claim 1, wherein the first integration stage is connected to a first offset injection circuit to apply during a third transfer phase a first predetermined offset value and/or the second integration stage is connected to a second offset injection circuit to apply during a fourth transfer phase a second predetermined offset value.

10. The signal conditioning circuit according to claim 9, wherein the signal output is connected to a first input of an adder,
    wherein a second input of the adder is connected to a third offset injection circuit, and
    wherein an output of the adder is connected to an analog-to-digital-converter input.

11. The signal conditioning circuit according to claim 10, wherein at least one of out of the first, second and third offset injection circuits comprises a folded cascode amplifier, respectively.

12. The signal conditioning circuit according to claim 1, wherein the an analog-to-digital converter comprises a converter input connected to the signal output or to the analog-to-digital-converter input, further comprising a converter output, the signal conditioning circuit further comprising:
    a controller unit comprising a controller input to receive an output signal of the analog-to-digital converter, comprising a first converter output to provide control signals to switches of the signal conditioning circuit, and comprising a second converter output for providing a proximity signal; and
    a driver circuit connected to the controller unit and configured to receive a synchronisation signal at a synchronisation input.

13. A sensor arrangement having a signal conditioning circuit according to claim 12, comprising:

a photo detector connected to the first sensor input; and
a light emitting device connected to the synchronisation input.

14. The sensor arrangement according to claim 13, wherein the driver circuit is synchronized with a duty cycle of the light emitting device.

15. The signal conditioning circuit according to claim 1, wherein the difference signal is generated from a differential charge transferred to a coupling capacitor in consecutive transfer phases, and wherein in the consecutive transfer phases the coupling capacitor is charged based on the integrated first and second integrated sensor signals, respectively.

16. The signal conditioning circuit according to claim 1, wherein the coupling stage combines the first and second integrated sensor signals to generate the difference signal, such that analog-to-digital conversion is performed after the first and second integrated sensor signals are sampled and held at the second integration stage as a final offset corrected common output, and
wherein the first integration stage, the second integration stage and the analog-to-digital converter are separate units that operate sequentially with respect to each other.

17. The signal conditioning circuit according to claim 1, wherein the first integration stage and the second integration stage implement a differential operation by generating the difference signal from the consecutively received integrated first and second integrated sensor signals, and
wherein the difference signal is configured to correct for offset and noise.

18. A method for signal conditioning for a light sensor, in particular for an ambient light sensor, comprising the steps of, in a first transfer phase:
integrate a first sensor signal;
transfer the integrated first sensor signal into a first integration stage;
transfer an integrated second sensor signal into a second integration stage;
comprising the steps of, in a second transfer phase:
integrate a second sensor signal;
transfer the integrated second sensor signal into the first integration stage; and
transfer the integrated first sensor signal into the second integration stage,
wherein the signal conditioning corresponds to an analog signal front end, and the first and second integration stages correspond to analog integrators,
wherein the signal conditioning is synchronized to a duty cycle of the light sensor such that the integrated first sensor signal is indicative of reflected light emitted by the light sensor and ambient light, and such that the integrated second sensor signal is indicative of ambient light,
wherein a coupling stage is connected between the first integration stage and the second integration stage and couples the first integration stage with the second integration stage, such that from consecutively received integrated first and second integrated sensor signals a difference signal is generated by the second integration stage,
wherein the difference signal is indicative of reflected light emitted by the light sensor,
wherein generating the difference signal corresponds to the signal conditioning in a differential operation mode, and
wherein an analog-to-digital converter, at an output side of the signal conditioning, corresponds to offset correction in the analog domain.

19. The method according to claim 18, wherein the difference signal is generated from a differential charge transferred to a coupling capacitor in consecutive transfer phases, and wherein in the consecutive transfer phases the coupling capacitor is charged based on the integrated first and second integrated sensor signals, respectively.

20. A signal conditioning circuit for a light sensor, comprising:
a first integration stage connected to a first sensor input to receive a first and second sensor signal;
a second integration stage comprising a coupling input to receive from the first integration stage an integrated first sensor signal and an integrated second sensor signal, wherein the signal conditioning circuit is an analog signal front end and the first and second integration stages correspond to analog integrators, and wherein the signal conditioning circuit is synchronized to a duty cycle of the light sensor such that the integrated first sensor signal is indicative of reflected light emitted by the light sensor and ambient light, and such that the integrated second sensor signal is indicative of ambient light;
a coupling stage connected between the first integration stage and the second integration stage and configured to couple the first integration stage with the second integration stage, such that from consecutively received integrated first and second integrated sensor signals a difference signal is generated by the second integration stage, wherein the difference signal is indicative of reflected light emitted by the light sensor, wherein generating the difference signal corresponds to the signal conditioning circuit operating in a differential operation mode, and wherein offset correction is implemented during the differential operation mode; and
an analog-to-digital converter at an output side of the signal conditional circuit, wherein the analog-to-digital converter corresponds to offset correction in the analog domain.

21. The signal conditioning circuit according to claim 20, wherein the difference signal is generated from a differential charge transferred to a coupling capacitor in consecutive transfer phases, and wherein in the consecutive transfer phases the coupling capacitor is charged based on the integrated first and second integrated sensor signals, respectively.

* * * * *

UNITED STATES PATENT AND TRADEMARK OFFICE
CERTIFICATE OF CORRECTION

PATENT NO. : 10,215,627 B2
APPLICATION NO. : 14/195801
DATED : February 26, 2019
INVENTOR(S) : Gonggui Xu, Lloyd Hasley and Cecil Aswell Page 1 of 1

It is certified that error appears in the above-identified patent and that said Letters Patent is hereby corrected as shown below:

In the Claims

Column 13, Lines 32-33, Claim 18:
Delete the phrase "in particular for an ambient light sensor,"

Signed and Sealed this
Sixteenth Day of July, 2019

Andrei Iancu
*Director of the United States Patent and Trademark Office*